(12) United States Patent
Lee

(10) Patent No.: US 7,554,470 B2
(45) Date of Patent: Jun. 30, 2009

(54) SELF-CALIBRATING PIPELINE ANALOG-TO-DIGITAL CONVERTER AND METHOD OF CALIBRATING A PIPELINE ANALOG-TO-DIGITAL CONVERTER

(75) Inventor: Ho-Young Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/982,747

(22) Filed: Nov. 5, 2007

(65) Prior Publication Data
US 2008/0106446 A1  May 8, 2008

(30) Foreign Application Priority Data
Nov. 6, 2006  (KR)  ............... 10-2006-0109183

(51) Int. Cl.
 *H03M 1/10* (2006.01)
(52) U.S. Cl. ............ 341/120; 341/118; 341/155; 341/161; 341/162
(58) Field of Classification Search ......... 341/118, 341/120.143, 155, 161, 162
See application file for complete search history.

(56) References Cited

U.S. PATENT DOCUMENTS

| | | | |
|---|---|---|---|
| 4,970,514 A | | 11/1990 | Draxelmayr |
| 5,047,772 A | * | 9/1991 | Ribner .................. 341/156 |
| 5,465,092 A | * | 11/1995 | Mayes et al. ........... 341/118 |
| 5,499,027 A | | 3/1996 | Karanicolas et al. |
| 5,594,612 A | | 1/1997 | Henrion |
| 5,684,487 A | | 11/1997 | Timko |
| 5,771,012 A | * | 6/1998 | Shu et al. .............. 341/118 |
| 6,184,809 B1 | * | 2/2001 | Yu ........................ 341/120 |
| 6,369,744 B1 | | 4/2002 | Chuang |
| 6,384,757 B1 | * | 5/2002 | Kosonen ................ 341/120 |
| 6,456,223 B1 | * | 9/2002 | Yu et al. ................ 341/161 |
| 6,563,445 B1 | * | 5/2003 | Sabouri ................. 341/120 |
| 6,606,042 B2 | * | 8/2003 | Sonkusale et al. ..... 341/120 |
| 6,734,818 B2 | * | 5/2004 | Galton .................. 341/161 |
| 6,822,601 B1 | * | 11/2004 | Liu et al. .............. 341/161 |

(Continued)

FOREIGN PATENT DOCUMENTS

JP  2005-318582  11/2005

(Continued)

OTHER PUBLICATIONS

Delic-Ibukic, Alma and Hummels, Donald M., 'Continuous Digital Calibration of Pipeline A/D Converters,' IMTC 2005—Instrumentation and Measurement Technology Conference, Proceedings of the IEEE Ottawa, Canada, May 17-19, 2005, vol. 1, p. 2-6.

*Primary Examiner*—Linh V Nguyen
(74) *Attorney, Agent, or Firm*—Mills & Onello LLP

(57) ABSTRACT

A pipeline analog-to-digital converter (ADC) having a digital calibrating circuit is described. The pipeline ADC includes a pipeline converting circuit and a digital calibrating circuit. The pipeline converting circuit has a plurality of one-bit stages, and converts an analog input signal into a first digital signal having a plurality of bits. The digital calibrating circuit extracts calibration coefficients for the one-bit stages, and calibrates a feedback signal based on the calibration coefficients and the first digital signal to generate a second digital signal having a plurality of bits. The pipeline ADC may perform digital calibration automatically with good linearity.

12 Claims, 15 Drawing Sheets

U.S. PATENT DOCUMENTS 6,970,120 B1 * 11/2005 Bjornsen .................... 341/120
7,187,310 B2 * 3/2007 El-Sankary et al. ......... 341/120
2006/0031037 A1 * 2/2006 Maloberti et al. ........... 702/126
2006/0077088 A1 4/2006 Matsui et al.

FOREIGN PATENT DOCUMENTS

KR 10-0446283 8/2004

* cited by examiner

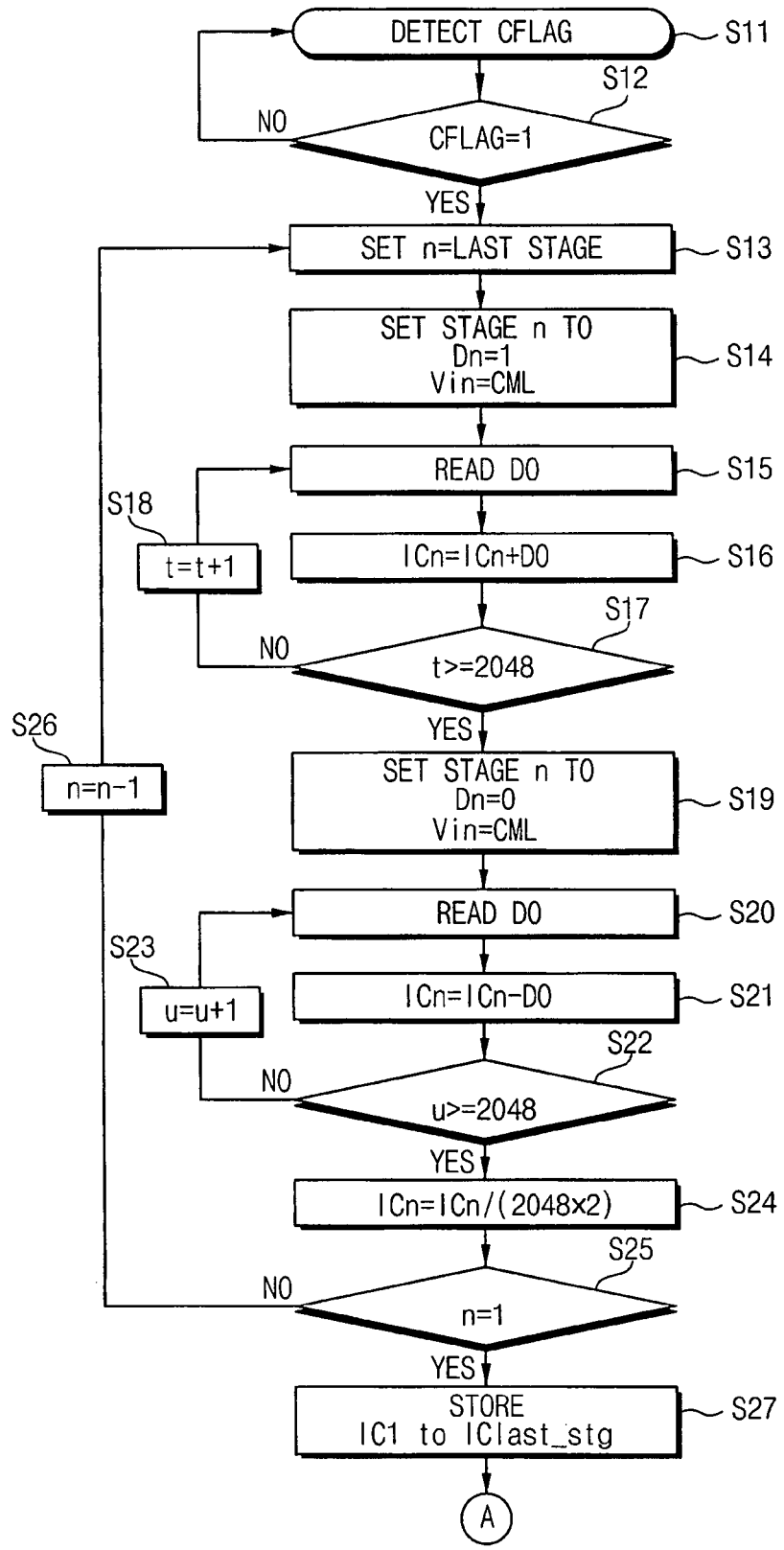

1360

FIG. 20A
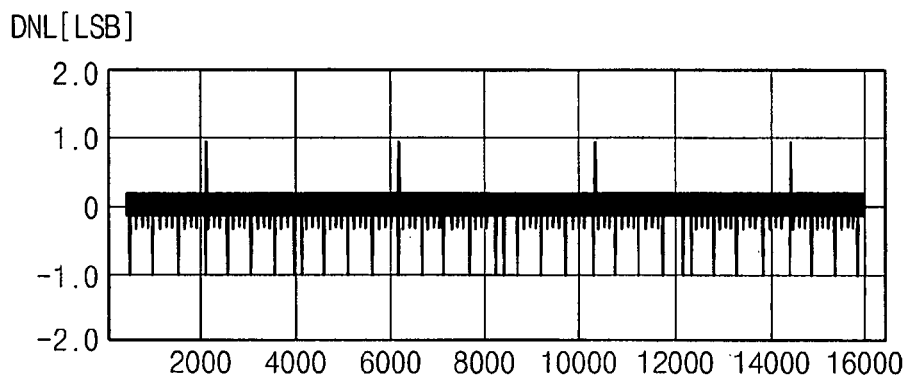
FIG. 20B
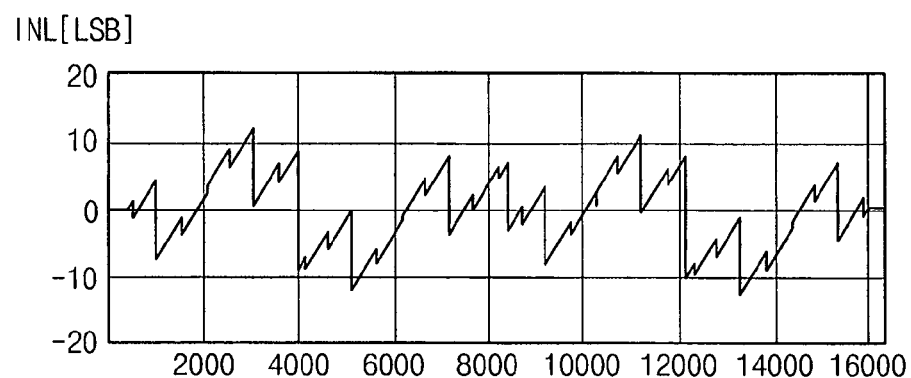
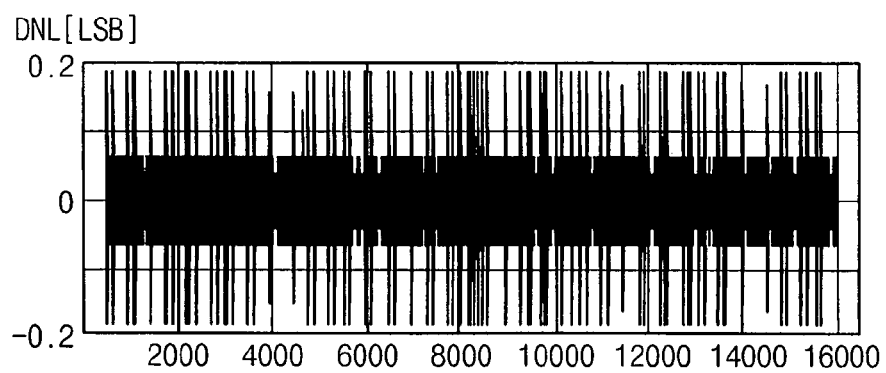
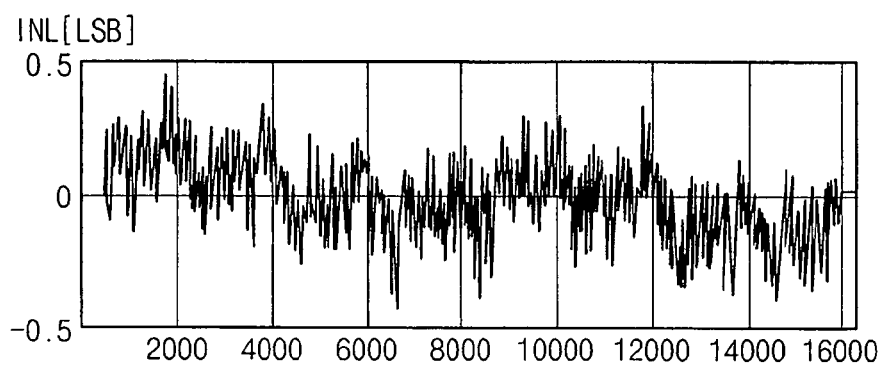

SELF-CALIBRATING PIPELINE ANALOG-TO-DIGITAL CONVERTER AND METHOD OF CALIBRATING A PIPELINE ANALOG-TO-DIGITAL CONVERTER

CROSS-REFERENCE TO RELATED APPLICATIONS

This application claims priority under 35 USC § 119 to Korean Patent Application No. 10-2006-109183, filed on Nov. 6, 2006 in the Korean Intellectual Property Office (KIPO), the contents of which are incorporated herein in their entirety by reference.

BACKGROUND OF THE INVENTION

1. Field of the Invention

The present invention relates to an analog-to-digital converter (ADC), and more particularly to a self-calibrating pipeline ADC and a method of self-calibrating the pipeline ADC.

2. Description of the Related Art

An analog-to-digital converter (ADC) is a device that quantizes electric signals that are used in digital signal processing. Two factors that characterize the performance of the ADC are resolution and sampling rate. The resolution represents the smallest amount of voltage or current into which the ADC can resolve the electric signals, and the sampling rate represents how fast the ADC can quantize the electric signals into digital output data.

An ADC having high resolution and high speed is required to improve the performance of a system. Further, the ADC having high performance is required for sophisticated digital signal processing. In the conventional art, it was not easy to reduce the fabrication cost because an ADC having high performance and high speed can be implemented using hybrid devices or discrete devices at high cost. Therefore, a metal-oxide semiconductor (MOS) integrated circuit (IC) process was needed to fabricate an ADC having high performance at low cost.

However, mismatching among MOS devices may be caused by limitations of fabrication process.

Accordingly, a calibration technique is needed to detect error factors caused by process mismatching and limited device characteristics and eliminate the error factors.

SUMMARY OF THE INVENTION

Accordingly, the present invention is provided to, substantially obviate one or more problems due to limitations and disadvantages of the related art.

Some example embodiments of the present invention provide a pipeline analog-to-digital converter (ADC) having a digital calibrating circuit that may be effectually employed in the ADC.

Some example embodiments of the present invention also provide a method of digitally calibrating a pipeline ADC.

According to a first aspect, the present invention is directed to a pipeline ADC, which includes a pipeline converting circuit and a digital calibrating circuit. The pipeline converting circuit has a plurality of one-bit stages and converts an analog input signal into a first digital signal having a plurality of bits. The digital calibrating circuit extracts calibration coefficients for the one-bit stages, and calibrates a feedback signal based on the calibration coefficients and the first digital signal to generate a second digital signal having a plurality of bits.

In one embodiment, the feedback signal is an output signal of the pipeline ADC. The digital calibrating circuit can be configured to generate the second digital signal in response to a flag signal.

In one embodiments, the digital calibrating circuit may include a basic digital calibrating circuit, a calibration control circuit, a calibration-coefficient extracting circuit, a calibration output circuit and an adder. The basic digital calibrating circuit performs a basic calibration on the first digital signal to generate a third digital signal. The calibration control circuit generates a reference clock signal, a first calibration control signal having a plurality of bits, and a second calibration control signal having a plurality of bits in response to a first clock signal and a first flag signal. The calibration-coefficient extracting circuit extracts a plurality of first calibration coefficients for the first digital signal in response to the reference clock signal, the first calibration control signal, the second calibration control signal and the feedback signal. The calibration output circuit generates a second calibration coefficient having a plurality of bits based on each bit of the first digital signal and the first calibration coefficients. The adder performs an add operation on the third digital signal and the second calibration coefficient to generate the second digital signal. The calibration control circuit can include: a clock generator configured to divide a frequency of the first clock signal to generate a second clock signal, the reference clock signal and the third clock signal; a flag generator configured to detect the first flag signal to generate a second flag signal in response to the second clock signal, the reference clock signal and the third clock signal; and a calibration control signal generator configured to generate the first calibration control signal and the second calibration control signal in response to the third clock signal and the second flag signal. The clock generator can include: a first clock divider configured to divide a frequency of the first clock signal by a first dividing ratio to generate the second clock signal; a second clock divider configured to divide a frequency of the second clock signal by a second dividing ratio to generate the reference clock signal; and a third clock divider configured to divide a frequency of the reference clock signal by a third dividing ratio to generate the third clock signal. The first dividing ratio can be 1/64, the second dividing ratio can be 1/33, and the third dividing ratio can be 1/2. The flag generator can include: a first pulse detector configured to detect an edge of the first flag signal in response to the second clock signal to generate a third flag signal; a second pulse detector configured to detect an edge of the third flag signal in response to the reference clock signal to generate a fourth flag signal; and a third pulse detector configured to detect an edge of the fourth flag signal in response to the third clock signal to generate the second flag signal. The calibration control signal generator can include: a flip-flop circuit having (2n)th flip-flops that operates in response to the third clock signal, and (2n−1)th flip-flops that operates in response to a fourth clock signal that is an inverted signal of the third clock signal, n being a positive integer; and an OR gate configured to perform a logical OR operation on output signals of two consecutive flip-flops among the (2n−1)th flip-flops to generate the second calibration control signal. Each bit of the first calibration control signal can be outputted at output terminals of the (2n)th flip-flops.

In one embodiment, the calibration-coefficient extracting circuit comprises: a plurality of calibration control signal generating circuits configured to perform logical operations on each bit of the first and second calibration control signal to generate a third calibration control signal, a fourth calibration control signal and a fifth calibration control signal; and a plurality of calibration-coefficient extracting units for generating each bit of the first calibrating coefficient in response to the reference clock signal, the third calibration control signal, the fourth calibration control signal and the fifth calibration control signal. Each of the calibration control signal generating circuits can include: an OR gate for performing a logical OR operation on each bit of the first and second calibration control signal to generate a third calibration control signal; a first inverter for inverting the first calibration control signal; a second inverter for inverting the second calibration control signal; a first AND gate for performing a logical AND operation on an output signal of the first inverter and each bit of the second calibration control signal to generate a fourth calibration control signal; and a second AND gate for performing a logical AND operation on an output signal of the second inverter and each bit of the first calibration control signal to generate a fifth calibration control signal.

In one embodiment, each of the calibration-coefficient extracting units comprises: a first selecting circuit configured to select one of a ground voltage and the second digital signal in response to the reference clock signal; a second selecting circuit configured to select one of an output signal of the first selecting circuit and the ground voltage in response to the third calibration control signal; a first flip-flop array configured to delay an output signal of the second selecting circuit; an adder configured to add a first feedback signal to an output signal of the first flip-flop array, and configured to subtract the fifth calibration control signal from the output signal of the first flip-flop array; a third selecting circuit configured to select one of the ground voltage and an output signal of the adder in response to the fourth calibration control signal; a fourth selecting circuit configured to select one of an output signal of the third selecting circuit and the ground voltage in response to the third calibration control signal; a second flip-flop array configured to delay an output signal of the fourth selecting circuit to output the first feedback signal; a first divider configured to divide a frequency of the first feedback signal by a first dividing ratio; and a second divider configured to divide a frequency of an output signal of the first divider by a second dividing ratio to generate each bit of the first calibration coefficient.

In one embodiment, the calibration output circuit comprises: a plurality of flip-flops configured to detect an edge of each bit of the first digital signal; a plurality of adders coupled in cascade, each of the adders configured to add an output signal of a prior stage to each of the first calibration coefficients and configured to subtract an output signal of each of the flip-flops from each of the first calibration coefficients; and a flip-flop array configured to delay an output signal of an adder that is located at the end of an array of the adders to output the second calibration coefficient in response to a clock signal and an inverted clock signal.

According to another aspect, the present invention is directed to a method of digitally calibrating a pipeline ADC. The method includes: performing a basic calibration on a first digital signal to generate a third digital signal; generating a reference clock signal, a first calibration control signal having a plurality of bits, and a second calibration control signal having a plurality of bits in response to a first clock signal and a first flag signal; extracting a plurality of-first calibration coefficients for the first digital signal in response to the reference clock signal, the first calibration control signal, the second calibration control signal and the feedback signal; generating a second calibration coefficient having a plurality of bits based on each bit of the first digital signal and the first calibration coefficients; and performing an add operation on the third digital signal and the second calibration coefficient to generate the second digital signal.

Therefore, the pipeline ADC according to the present invention performs digital calibration automatically with good linearity.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating, the principles of the invention.

FIG. 3 and FIG. 4 are flow charts illustrating a method of calibrating a pipeline ADC according to an example embodiment of the present invention.

FIG. 20A and FIG. 20B are simulation diagrams illustrating the operation of the pipeline ADC according to an example embodiment of the present invention.

DESCRIPTION OF THE EMBODIMENTS

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
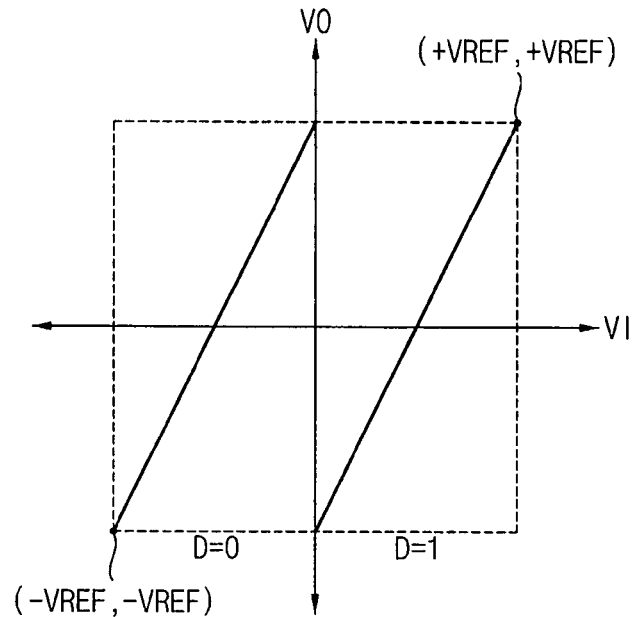
FIG. 1A is a graph illustrating transfer characteristics of an ideal pipeline analog-to-digital converter (ADC).
Figure 1B:
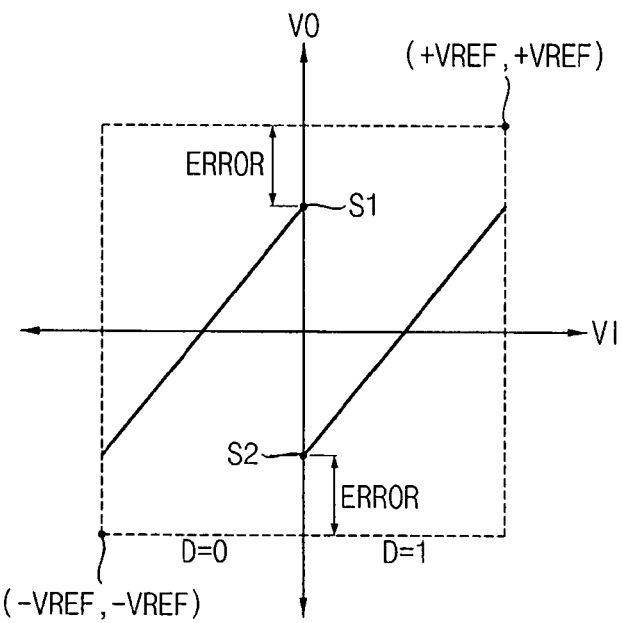
FIG. 1B is a graph illustrating transfer characteristics of an actual pipeline ADC.

FIG. 1A illustrates transfer characteristics of an ideal pipeline ADC, and FIG. 1B illustrates transfer characteristics of an actual pipeline ADC. In FIG. 1A and FIG. 1B, VI denotes an input voltage, VO denotes an output voltage, and VREF denotes a reference voltage.

Referring to FIG. 1A, in an ideal case, a curve representing data "0" (D=0) has an output voltage (VO) of +VREF when the input voltage (VI) is 0 V, and a curve representing data "1" (D=1) has an output voltage of −VREF when the input voltage (VI) is 0 V. Referring to FIG. 1B, in an actual case, a curve representing data "0" (D=0) has an output voltage (VO) of S1 instead of +VREF when the input voltage (VI) is 0 V, and a curve representing data "1" (D=1) has an output voltage of S2 instead of −VREF when the input voltage (VI) is 0 V.

A difference between S1 and +VREF, or a difference between S2 and −VREF corresponds to an error. This error may be caused by a mismatch of a metal-oxide semiconductor (MOS) process or limited device characteristics. The linearity of a pipeline ADC may be reduced because there may be a difference between transfer characteristics of a pipeline ADC in the ideal case and transfer characteristics of the pipeline ADC in the actual case.

Figure 2A:
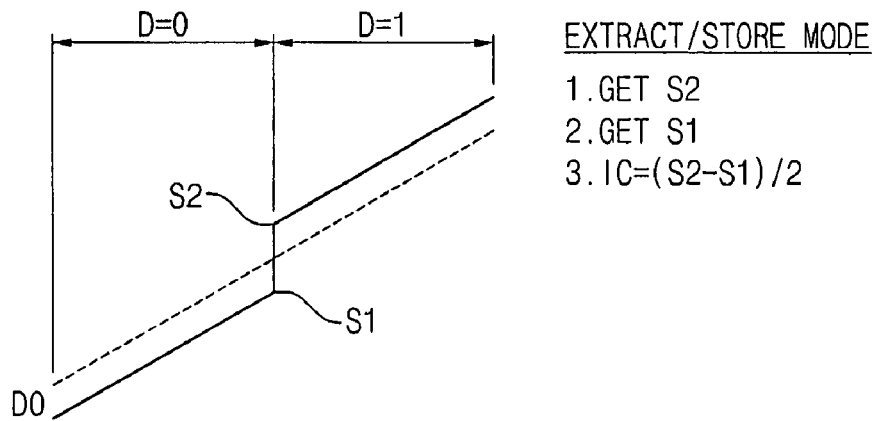
FIG. 2A and FIG. 2B are diagrams illustrating the concept of a method of calibrating a pipeline ADC according to an example embodiment of the present invention.
Figure 2B:
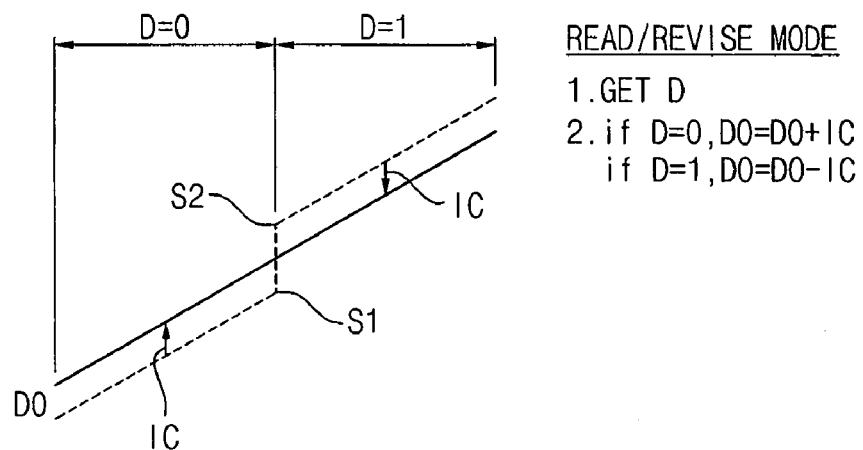

FIG. 2A and FIG. 2B are diagrams illustrating the concept of a method of calibrating a pipeline ADC according to an example embodiment of the present invention.

Referring to FIG. 2A and FIG. 2B, calibrating modes of a pipeline ADC include an EXTRACT/STORE mode and a READ/REVISE mode. As shown in FIG. 1B, S1 is a value of the output voltage (VO) at the conjunction point of a curve representing data "0" (D=0) and the vertical axis, and S2 is a value of the output voltage (VO) at the conjunction point of a curve representing data "1" (D=1) and the vertical axis.

Referring to FIG. 2A, in the EXTRACT/STORE mode, the following process is performed.
 1) Get S2.
 2) Get S1.
 3) Calculate (S2−S1)/2 and assign the resulting value to IC.
Referring to FIG. 2B, in the READ/REVISE mode, the following process is performed.
 1) Get data D.
 2) If D is "0", then add the value of IC to output data DO.
 3) If D is "1", then subtract the value of IC from the output data DO.

The calibration of a pipeline ADC may be executed in response to a flag signal as will be described below.

Figure 4:
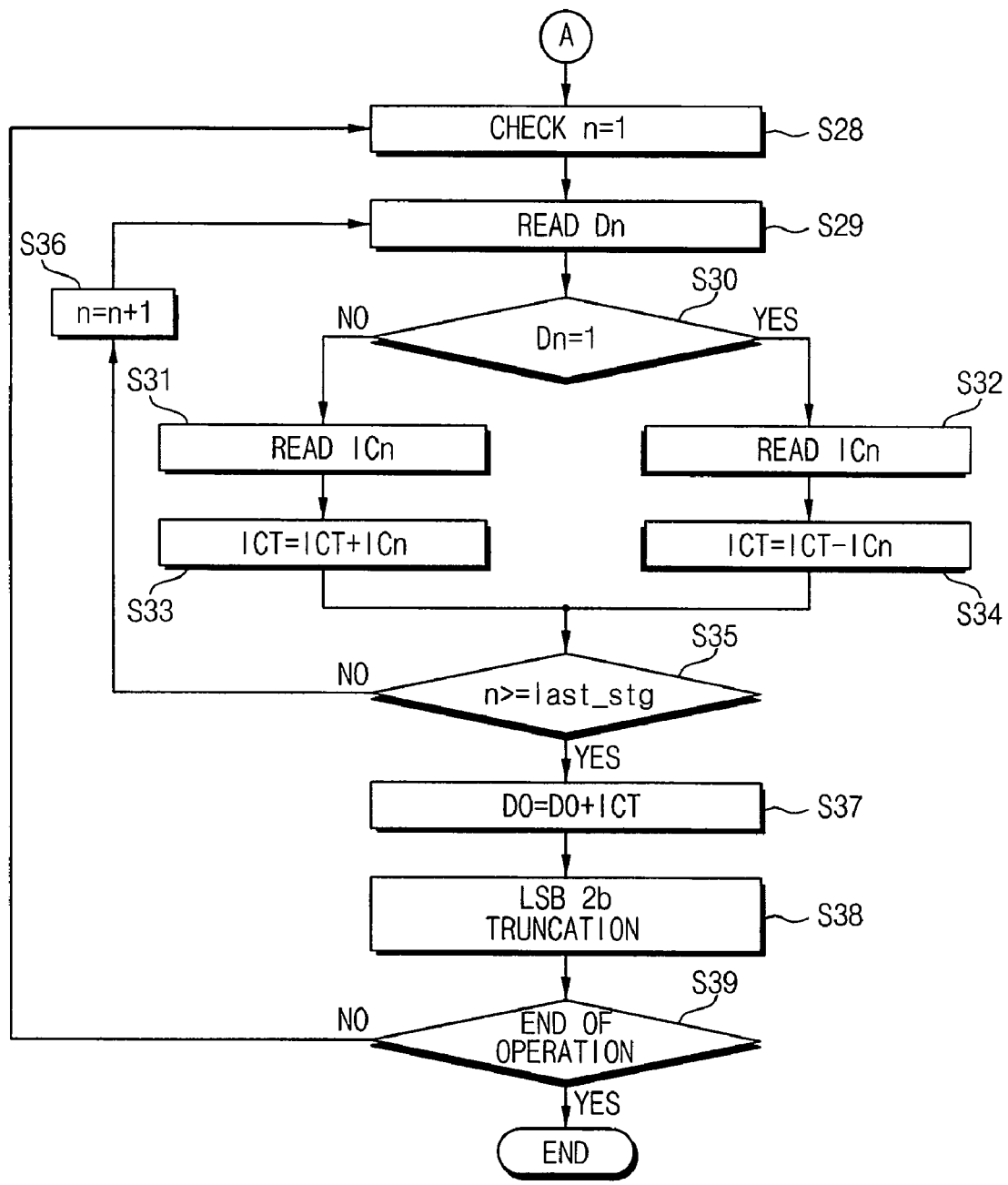

FIG. 3 and FIG. 4 are flow charts illustrating a method of calibrating a pipeline ADC according to an example embodiment of the present invention. FIG. 3 illustrates a calibration process of an ADC in the EXTRACT/STORE mode, and FIG. 4 illustrates a calibration process of an ADC in the READ/REVISE mode. In FIG. 3 and FIG. 4, last_stg represents a last stage.

Referring to FIG. 3, the calibration process of an ADC in the EXTRACT/STORE mode is as follows.
 1) Detect flag signal CFLAG (step S11).
 2) Determine if CFLAG is "1" (step S12). If CFLAG is not "1" (step S12: NO), then detect CFLAG again.
 3) If CFLAG is "1" (step S12: YES), then assign the last stage to n (step S13).
 4) Set Dn=1 and Vin=CML for stage n. Here, CML represents a middle value (step S14).
 5) Read output data (DO)(step S15).
 6) Execute ICn=ICn+DO (step S16).
 7) Determine if t is greater than or equal to 2048 (step S17).
 8) If t is smaller than 2048 (step S17: NO), then execute t=t+1 and go to step S15 (S18):
 9) If t is greater than or equal to 2048 (step S17: YES), then set Dn=0 and Vin=CML for stage n (S19).
 10) Read output data (DO)(step S20).
 11) Execute ICn=ICn−DO (step S21).
 12) Determine if u is greater than or equal to 2048 (step S22).
 13) If u is smaller than 2048 (step S22: NO), then execute u=u+1 and go to step S20 (S23).
 14) If u is greater than or equal to 2048 (step S22: YES), then execute ICn=ICn/(2048×2)(step S24).
 15) Determine if n is "1" (S25).
 16) If n is not "1" (S25: NO), then execute n=n−1 and go to step S13 (S26).
 17) If n is "1" (S25: YES), then store IC1 to IClast_stg (S27).

Referring to FIG. 4, the calibration process of the ADC in the READ/REVISE mode is as follows.
 1) Check if n is "1" (step S28).
 2) Read input data Dn (step S29).
 3) Determine if Dn is "1" (S30).

4) If Dn is not "1" (S30: NO), then read ICn (step S31) and execute ICT=ICT+ICn (step S33).
5) If Dn is "1" (S30: YES), then read ICn (step S32) and execute ICT=ICT−ICn (step S34).
6) Determine if n is greater than or equal to last_stg (step S35).
7) If n is smaller than last_stg (step S35: NO), then execute n=n+1 and go to step S29 (step S36).
8) If n is greater than or equal to last_stg (step S35: YES), then execute DO=DO+ICT (step S37).
9) Truncate lowermost two bits (step S38).
10) Determine if an operation is the last operation (step S39). If the operation is not the last operation (step S39: NO), then go to step S28.
11) If the operation is the last operation (step S39: YES), then end the operation.

Figure 5:
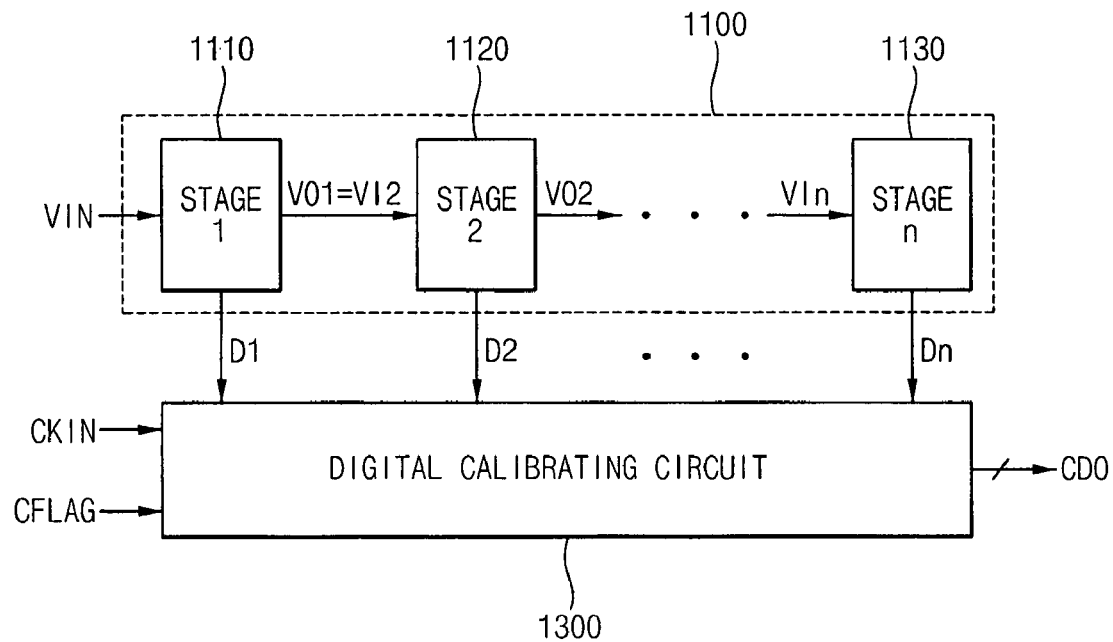
FIG. 5 is a block diagram illustrating a pipeline ADC according to an example embodiment of the present invention.

FIG. 5 is a block diagram illustrating a pipeline ADC 1000 according to an example embodiment of the present invention.

Referring to FIG. 5, the pipeline ADC 1000 includes a pipeline converting circuit 1100 and a digital calibrating circuit 1300.

The pipeline converting circuit 1100 has one-bit stages 1110, 1120 and 1130, and converts an analog input signal VIN into a first digital signal D1 to Dn having a plurality of bits. The digital calibrating circuit 1300 receives the first digital signal D1 to Dn from the pipeline converting circuit 1100. The digital calibrating circuit 1300 extracts calibration coefficients for the one-bit stages, and calibrates a feedback signal based on the calibration coefficients and the first digital signal D1 to Dn to generate a second digital signal CDO having a plurality of bits.

Referring to FIG. 5, an output signal VO1 of the first stage 1110 becomes an input signal VI2 of the second stage 1120, and an output signal of the (n−1)th stage (not shown) becomes an input signal VIn of the nth stage 1130.

Figure 6:
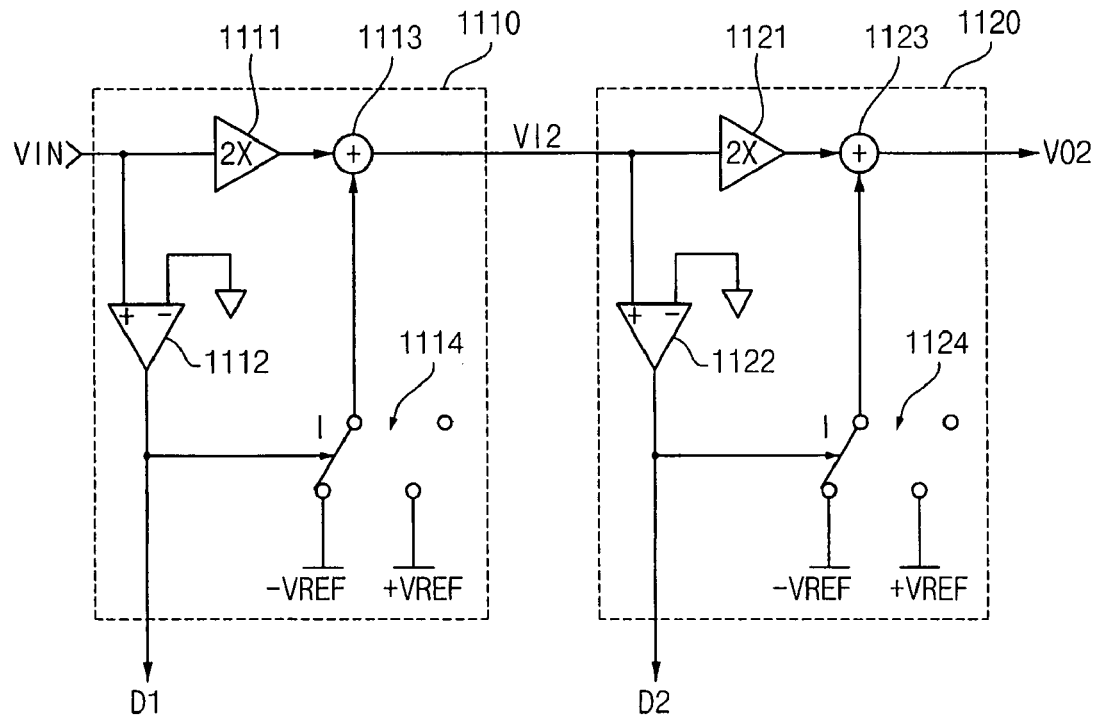
FIG. 6 is a circuit diagram illustrating a structure of stages of a pipeline converting circuit in the pipeline ADC of FIG. 5.

FIG. 6 is a circuit diagram illustrating a structure of stages of a pipeline converting circuit in the pipeline ADC of FIG. 5.

Referring to FIG. 6, the first stage 1110 of the pipeline converting circuit 1100 includes a first amplifier 1111, a first comparator 1112, a first selecting circuit 1114 and a first adder 1113.

The first amplifier 1111 amplifies the analog input signal VIN by a gain of two. The first comparator 1112 compares the analog input signal VIN with the ground voltage. An output signal of the first comparator 1112 becomes a first bit D1 of the first digital signal. The first selecting circuit 1114 may be composed of a switch, and operates in response to the first bit D1 of the first digital signal. The first selecting circuit 1114 selects −VREF when the first bit D1 of the first digital signal is logic "1", and selects +VREF when the first bit D1 of the first digital signal is logic "0". The first adder 1113 adds an output signal of the first selecting circuit 1114 to an output signal of the first amplifier 1111.

The second stage 1120 of the pipeline converting circuit 1100 includes a second amplifier 1121, a second comparator 1122, a second selecting circuit 1124 and a second adder 1123.

The second amplifier 1121 amplifies the output signal VI2 of the first stage 1110 by a gain of two. The second comparator 1122 compares the output signal VI2 of the first stage 1110 with the ground voltage. An output signal of the second comparator 1122 becomes a second bit D2 of the first digital signal. The second selecting circuit 1124 may be composed of a switch, and operates in response to the second bit D2 of the first digital signal. The second selecting circuit 1124 selects −VREF when the second bit D2 of the first digital signal is logic "1", and selects +VREF when the second bit D2 of the first digital signal is logic "0". The second adder 1123 adds an output signal of the second selecting circuit 1124 to an output signal of the second amplifier 1111 and generates an output signal VO2 of the second stage 1120.

Figure 7:
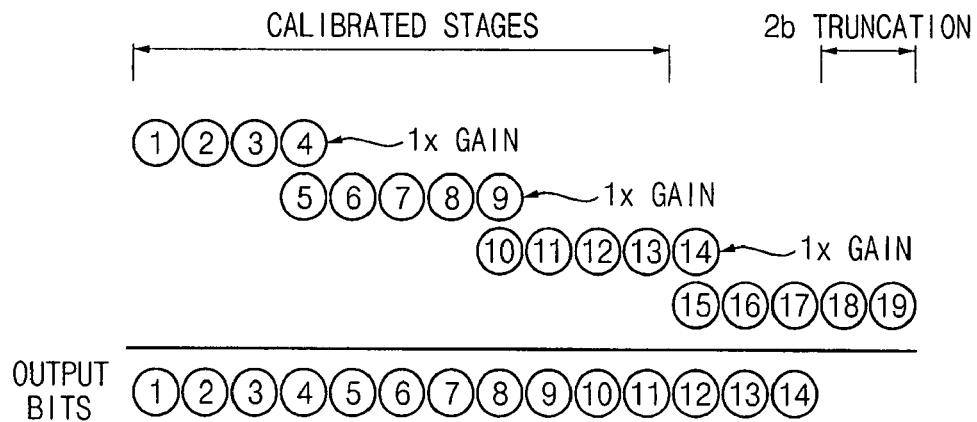
FIG. 7 is a diagram illustrating the architecture of the pipeline ADC of FIG. 5.

FIG. 7 is a diagram illustrating the architecture of the pipeline ADC 1000 of FIG. 5. In FIG. 7, each amplifier included in a fourth stage (4), a ninth stage (9) and a fourteenth stage (14) has a gain of one. The architecture of the pipeline ADC shown in FIG. 7 includes nineteen one-bit stages from stage 1 to stage 19, but output bits include fourteen bits. The fourth stage (4) and the fifth stage (5) are designed to be overlapped. Further, the ninth stage (9) and the tenth stage (10) are designed to be overlapped, and the fourteenth stage (14) and the fifteenth stage (15) are designed to be overlapped.

The architecture of the pipeline ADC shown in FIG. 7 calibrates thirteen stages from the first stage to the thirteenth stage in full calibration mode. Calibrated stages may be selected in response to an external control signal. Truncation errors may be caused in a binary operation because the digital calibration changes a value of analog error into a digital value. Two one-bit stages (the eighteenth stage and the nineteenth stage) are added in order to maintain the truncation error lower than a fourth of a least significant bit (LSB).

Figure 8:
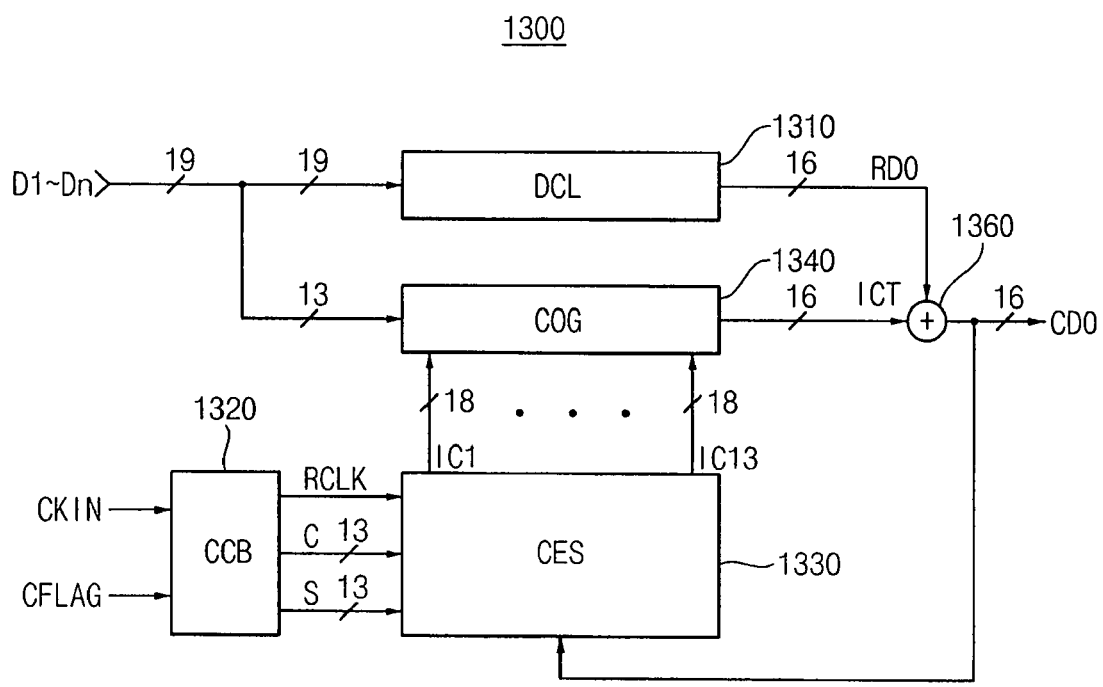
FIG. 8 is a block diagram illustrating a digital calibrating circuit in the pipeline ADC of FIG. 5.

FIG. 8 is a block diagram illustrating a digital calibrating circuit in the pipeline ADC 1000 of FIG. 5.

Referring to FIG. 8, the digital calibrating circuit 1300 includes a basic digital calibrating circuit 1310, a calibration control circuit 1320, a calibration-coefficient extracting circuit 1330, a calibration output circuit 1340 and an adder 1360.

The basic digital calibrating circuit 1310 performs a basic calibration on the first digital signal D1 to Dn to generate a third digital signal RDO. The calibration control circuit 1320 generates a reference clock signal RCLK, a first calibration control signal C having a plurality of bits, and a second calibration control signal S having a plurality of bits in response to a first clock signal CKIN and a first flag signal CFLAG. The calibration-coefficient extracting circuit 1330 extracts a plurality of first calibration coefficients IC1 to IC13 for the first digital signal D1 to Dn in response to the reference clock signal RCLK, the first calibration-control signal C, the second calibration control signal S and the feedback signal. The calibration output circuit 1340 generates a second calibration coefficient ICT having a plurality of bits based on each bit of the first digital signal D1 to Dn and the first calibration coefficients IC1 to IC13. The adder 1360 performs an add operation on the third digital signal RDO and the second calibration coefficient ICT to generate the second digital signal CDO.

Figure 9:
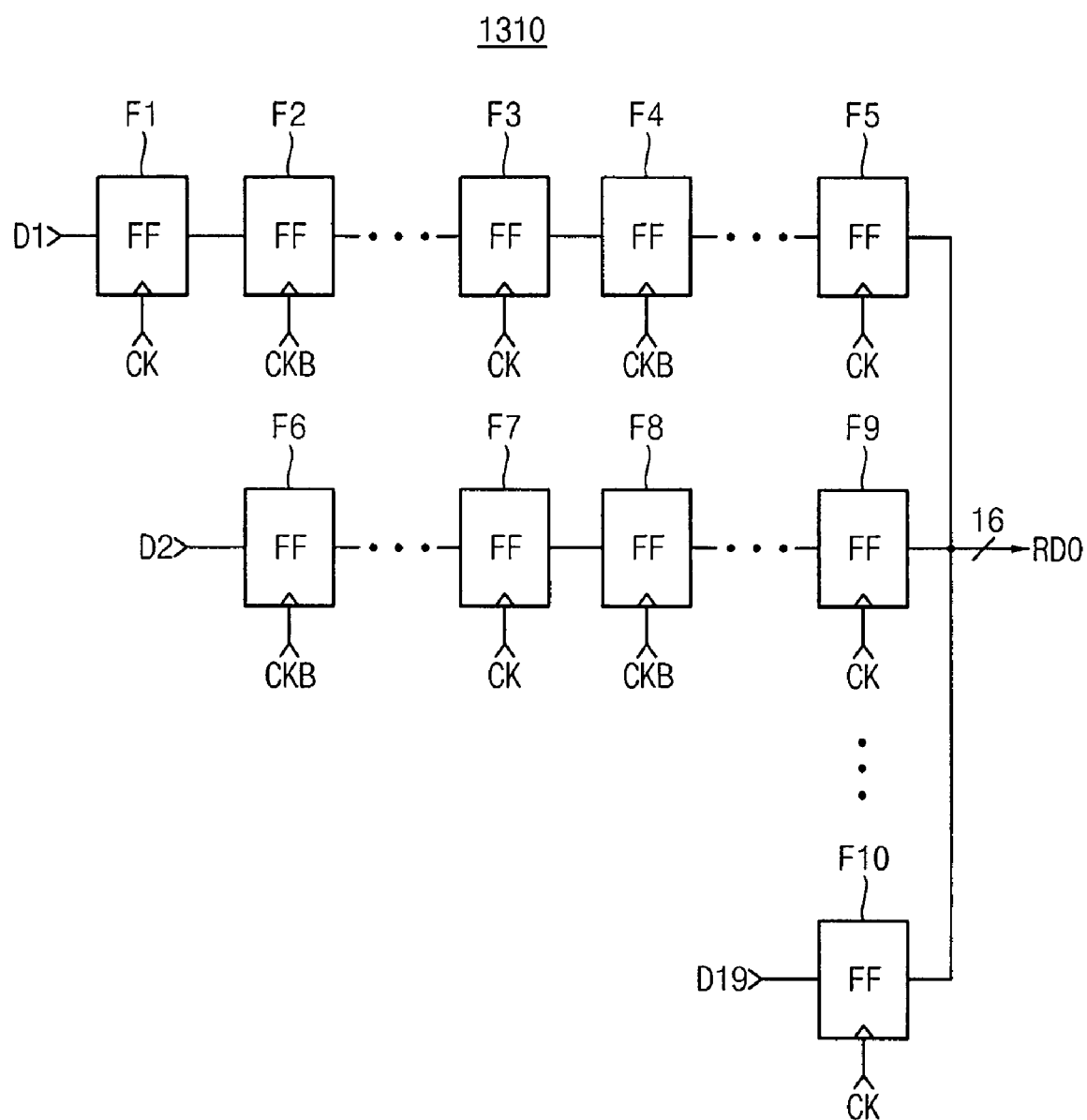
FIG. 9 is a circuit diagram illustrating a basic digital calibrating circuit in-the digital calibrating circuit of FIG. 8.

FIG. 9 is a circuit diagram illustrating a basic digital calibrating circuit in the digital calibrating circuit 1300 of FIG. 8.

Referring to FIG. 9, the basic digital calibrating circuit 1310 includes flip-flop arrays that delay each bit of the first digital signal D1 to Dn in response to a clock signal CK and an inverted clock signal CKB.

A first flip-flop array includes flip-flops F1, F2, F3, F4 and F5, and delays a first bit D1 of the first digital signal D1 to Dn in response to the clock signal CK and the inverted clock signal CKB. A second flip-flop array includes flip-flops F6, F7, F8, and F9, and delays a second bit D2 of the first digital signal D1 to Dn in response to the clock signal CK and the inverted clock signal CKB. As such, a nineteenth flip-flop array includes a flip-flop F10, and delays a nineteenth bit D19 of the first digital signal D1 to Dn in response to the clock signal CK. The basic digital calibrating circuit 1310 outputs output signals of sixteen flip-flop arrays among nineteen flip-flop arrays as the third digital signal RDO.

Figure 10:
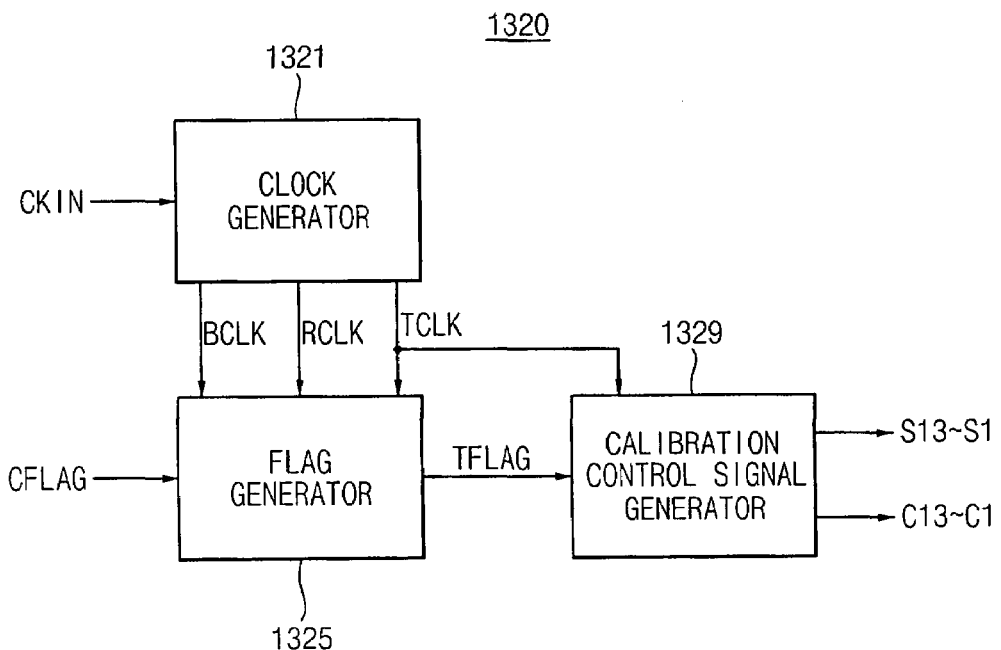
FIG. 10 is a block diagram illustrating a calibration control circuit in the digital calibrating circuit of FIG. 8.

FIG. 10 is a block diagram illustrating a calibration control circuit in the digital calibrating circuit 1300 of FIG. 8.

Referring to FIG. 10, the calibration control circuit 1320 includes a clock generator 1321, a flag generator 1325 and a calibration control signal generator 1329.

The clock generator 1321 divides a frequency of the first clock signal CKIN to generate a second clock signal BCLK, the reference clock signal RCLK and the third clock signal TCLK. The flag generator 1325 detects the first flag signal CFLAG to generate a second flag signal TFLAG in response to the second clock signal BCLK, the reference clock signal RCLK and the third clock signal TCLK. The calibration control signal generator 1329 generates the first calibration control signal C1 to C13 and the second calibration control signal S1 to S13 in response to the third clock signal TCLK and the second flag signal TFLAG.

Figure 11:
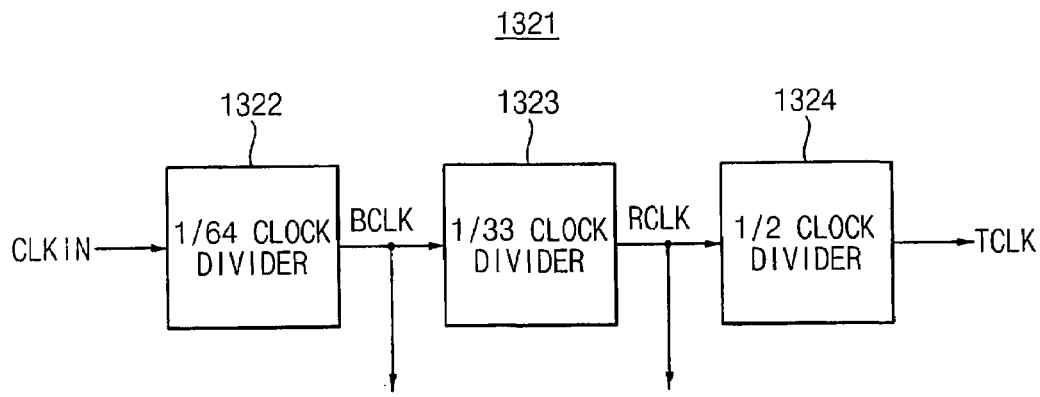
FIG. 11 is a block diagram illustrating a clock generator in the calibration control circuit of FIG. 10.

FIG. 11 is a block diagram illustrating a clock generator in the calibration. control circuit 1320 of FIG. 10.

Referring to FIG. 11, the clock generator 1321 includes a first clock divider 1322, a second clock divider 1323 and a third clock divider 1324.

The first clock divider 1322 divides a frequency of the first clock signal CKIN by a dividing ratio of 1/64 to generate the second clock signal BCLK. The second clock divider 1323 divides a frequency of the second clock signal BCLK by a dividing ratio of 1/33 to generate the reference clock signal RCLK. The third clock divider 1324 divides a frequency of the reference clock signal RCLK by a dividing ratio of 1/2 to generate the third clock signal TCLK.

Figure 12:
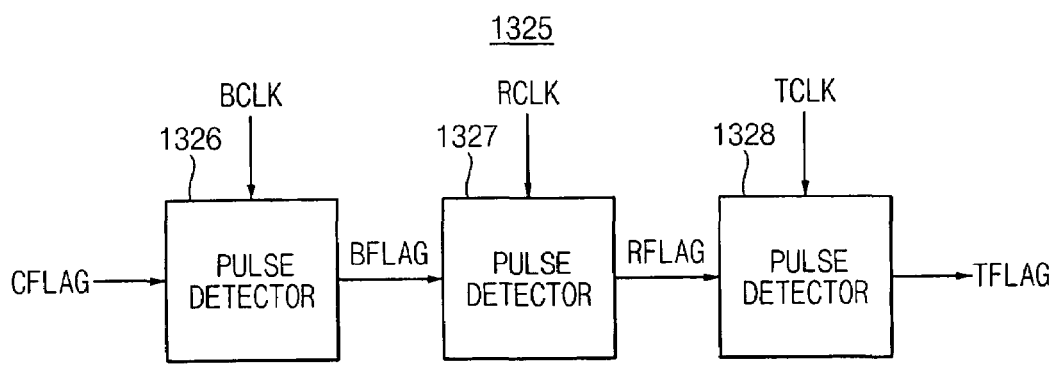
FIG. 12 is a block diagram illustrating a flag generator in the calibration control circuit of FIG. 10.

FIG. 12 is a block diagram illustrating a flag generator in the calibration control circuit 1320 of FIG. 10.

Referring to FIG. 12, the flag generator 1325 includes a first pulse detector 1326, a second pulse detector 1327 and a third pulse detector 1328.

The first pulse detector 1326 detects an edge of the first flag signal CFLAG in response to the second clock signal BCLK to generate a third flag signal BFLAG. The second pulse detector 1327 detects an edge of the third flag signal BFLAG in response to the reference clock signal RCLK to generate a fourth flag signal RFLAG. The third pulse detector 1328 detects an edge of the fourth flag signal RFLAG in response to the third clock signal TCLK to generate the second flag signal TFLAG.

Figure 13:
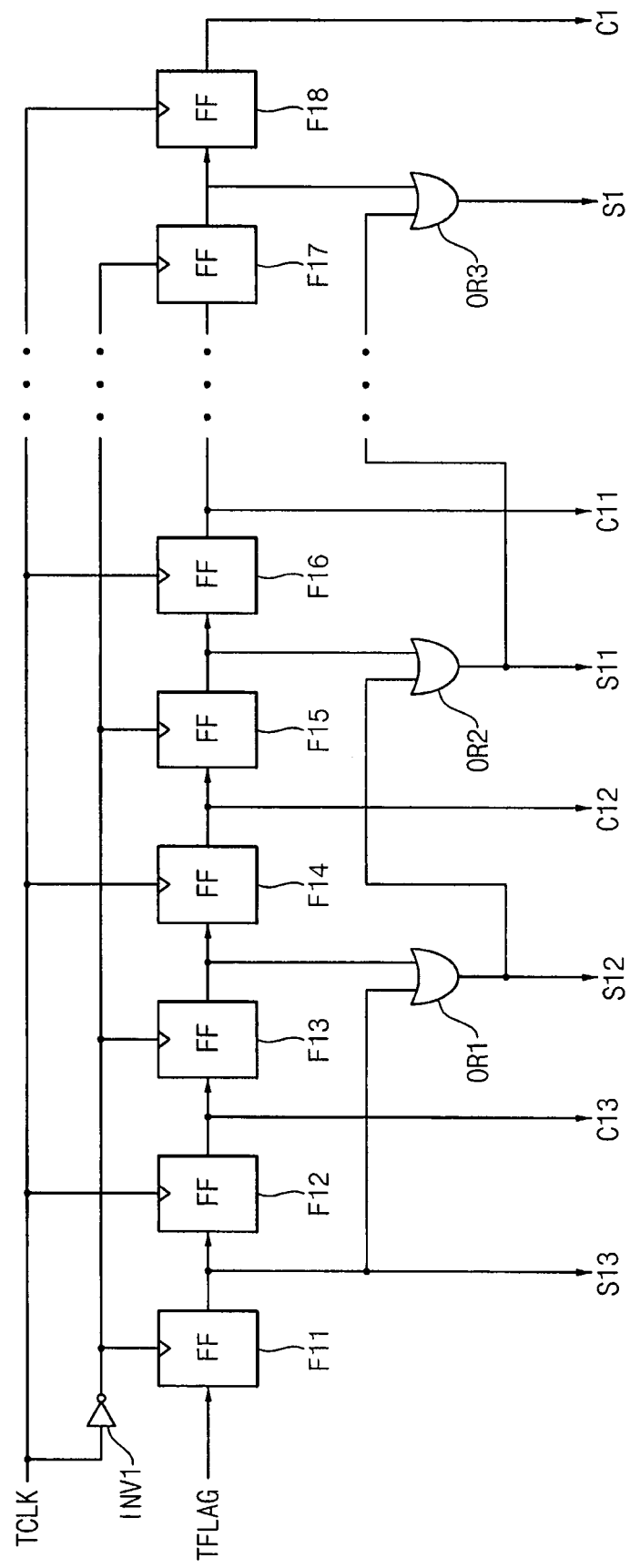
FIG. 13 is a circuit diagram illustrating a calibration control signal generator in the calibration control circuit of FIG. 10.

FIG. 13 is a circuit diagram illustrating a calibration control signal generator in the calibration control circuit 1320 of FIG. 10.

Referring to FIG. 13, the calibration control signal generator 1329 includes an inverter INV1, flip-flops F11 to F18 and OR gates OR1, OR2 and OR3.

The inverter INV1 inverts the third clock signal TCLK. An output signal of the inverter INV1, i.e., an inverted signal of the third clock signal TCLK is applied to the flip-flops F11, F13, F15 and F17, and the third clock signal TCLK is applied to the flip-flops F12, F14, F16 and F18. The first flip-flop F11 detects an edge of the second flag signal TFLAG in response to the output signal of the inverter INV1. The second flip-flop F12 detects an edge of an output signal of the first flip-flop F11 in response to the third clock signal TCLK. The third flip-flop F13 detects an edge of an output signal of the second flip-flop F12 in response to the output signal of the inverter INV1. The fourth flip-flop F14 detects an edge of an output signal of the third flip-flop F13 in response to the third clock signal TCLK. The fifth flip-flop F15 detects an edge of an output signal of the fourth flip-flop F14 in response to the output signal of the inverter INV1. The sixth flip-flop F16 detects an edge of an output signal of the fifth flip-flop F15 in response to the third clock signal TCLK. The seventh flip-flop F17 detects an edge of an output signal of the sixth flip-flop F16 in response to the output signal of the inverter INV1. The eighth flip-flop F18 detects an edge of an output signal of the seventh flip-flop F17 in response to the third clock signal TCLK.

The first OR gate OR1 performs a logical OR operation on an output signal of the first flip-flop F11 and an output signal of the third flip-flop F13 to generate a twelfth bit S12 of the second calibration control signal S. The second OR gate OR2 performs a logical OR operation on an output signal of the first OR gate OR1 and an output signal of the fifth flip-flop F1 5 to generate an eleventh bit S11 of the second calibration control signal S. The sixth OR gate OR3 performs a logical OR operation on an output signal of the fifth OR gate (not shown) and an output signal of the seventh flip-flop F17 to generate a first bit S1 of the second calibration control signal S.

An output signal of the first flip-flop F11 is a thirteenth bit S13 of the second calibration control signal S. An output signal of the second flip-flop F12 is a thirteenth bit C13 of the first calibration control signal C. An output signal of the fourth flip-flop F14 is a twelfth bit C12 of the first calibration control signal C. An output signal of the sixth flip-flop F16 is an eleventh bit C11 of the first calibration control signal C. As such, an output signal of the eighth flip-flop F18 is a first bit C1 of the first calibration control signal C.

Figure 14:
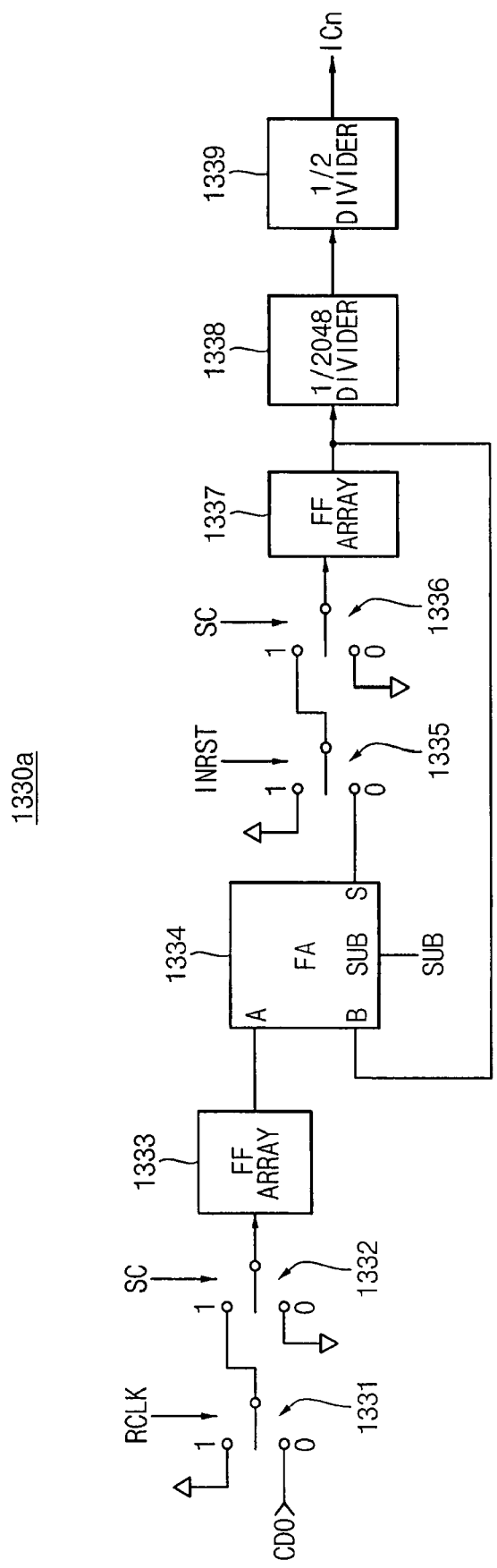
FIG. 14 is a circuit diagram illustrating a part of the calibration-coefficient extracting circuit in the digital calibrating circuit of FIG. 8.

FIG. 14 is a circuit diagram illustrating a part of the calibration-coefficient extracting circuit 1330 in the digital calibrating circuit 1300 of FIG. 8.

The calibration-coefficient extracting circuit 1330 may include a plurality of calibration control signal generating circuits and a plurality of calibration-coefficient extracting units 1330a as shown in FIG. 14. Each of the calibration control signal generating circuits performs logical operations on each bit C1 to Cn of the first calibration control signal C and each bit S1 to Sn of the second calibration control signal S to generate a third calibration control signal SC, a fourth calibration control signal INRST and a fifth calibration control signal SUB. Each of the calibration-coefficient extracting units generates each bit ICn of the first calibrating coefficient IC in response to the reference clock signal RCLK, the third calibration control signal SC, the fourth calibration control signal INRST and the fifth calibration control signal SUB.

Referring to FIG. 14, the calibration-coefficient extracting unit 1330a includes a first selecting circuit 1331, a second selecting circuit 1332, a first flip-flop array 1333, an adder 1334, a third selecting circuit 1335, a fourth selecting circuit 1336, a second flip-flop array 1337, a first divider 1338 and a second divider 1339.

The first selecting circuit 1331 selects one of a ground voltage and the second digital signal CDO in response to the reference clock signal RCLK. The second selecting circuit 1332 selects one of an output signal of the first selecting circuit 1331 and the ground voltage in response to the third calibration control signal SC. The first flip-flop array 1333 delays an output signal of the second selecting circuit 1332. The adder 1334 adds a first feedback signal to an output signal of the first flip-flop array 1333, and subtracts the fifth calibration control signal SUB from the output signal of the first flip-flop array 1333. The first feedback signal is an output signal of the second flip-flop array 1337. The third selecting circuit 1335 selects one signal of the ground voltage and an output signal of the adder 1334 in response to the fourth calibration control signal INRST. The fourth selecting circuit 1336 selects one signal of an output signal of the third selecting circuit 1335 and the ground voltage in response to the third calibration control signal SC. The second flip-flop array 1337 delays an output signal of the fourth selecting circuit 1336 to output the first feedback signal. The first divider 1338 divides a frequency of the first feedback signal by a dividing ratio of 1/2048. The second divider 1339 divides a frequency of an output signal of the first divider 1338 by a dividing ratio of 1/2.

Figure 15:
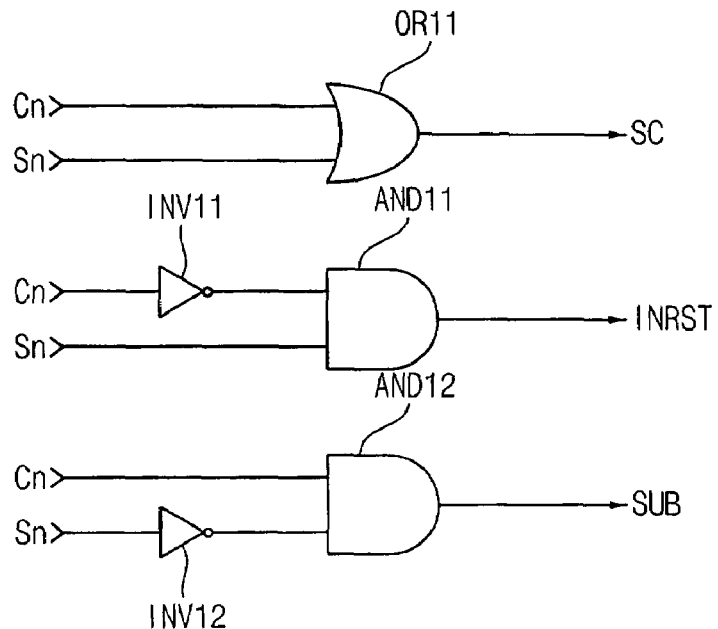
FIG. 15 is a circuit diagram illustrating a control signal generator for generating control signals provided to the calibration-coefficient extracting circuit of FIG. 14.

FIG. 15 is a circuit diagram illustrating a control signal generator for generating control signals provided to the calibration-coefficient extracting unit 1330a of FIG. 14. The calibration-coefficient extracting circuit 1330 shown in FIG. 8 may include a plurality of control signal generating circuit as shown in FIG. 15.

Referring to FIG. 15, each of the calibration control signal generating circuits includes an OR gate OR11, a first inverter INV11, a second inverter INV12, a first AND gate AND11 and a second AND gate AND12.

The OR gate OR11 performs a logical OR operation on each bit Cn of the first calibration control signal C and each bit Sn of the second calibration control signal S to generate a third calibration control signal SC. The first inverter INV11 inverts each bit Cn of the first calibration control signal C. The second inverter INV12 inverts each bit Sn of the second calibration control signal S. The first AND gate AND11 performs a logical AND operation on an output signal of the first inverter INV11 and each bit Sn of the second calibration control signal to generate a fourth calibration control signal INRST. The second AND gate AND12 performs a logical AND operation on an output signal of the second inverter INV12 and each bit Cn of the first calibration control signal C to generate a fifth calibration control signal SUB.

Figure 16:
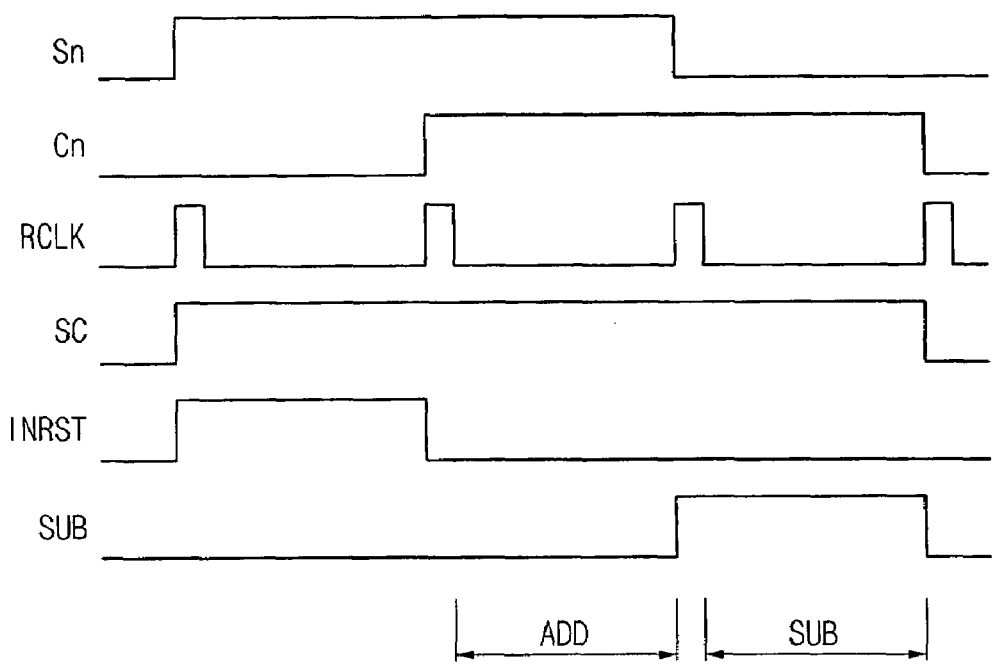
FIG. 16 is a timing diagram illustrating the operation of the control signal generator of FIG. 15.

FIG. 16 is a timing diagram illustrating the operation of the control signal generator of FIG. 15. As shown in FIG. 16, Sn and Cn are generated in response to the reference clock signal RCLK. The adder 1334 in FIG. 14 operates in an adding mode when the fifth calibration control signal SUB is disabled. On the contrary, the adder 1334 operates in a subtracting mode when the fifth calibration control signal SUB is enabled.

Figure 17:
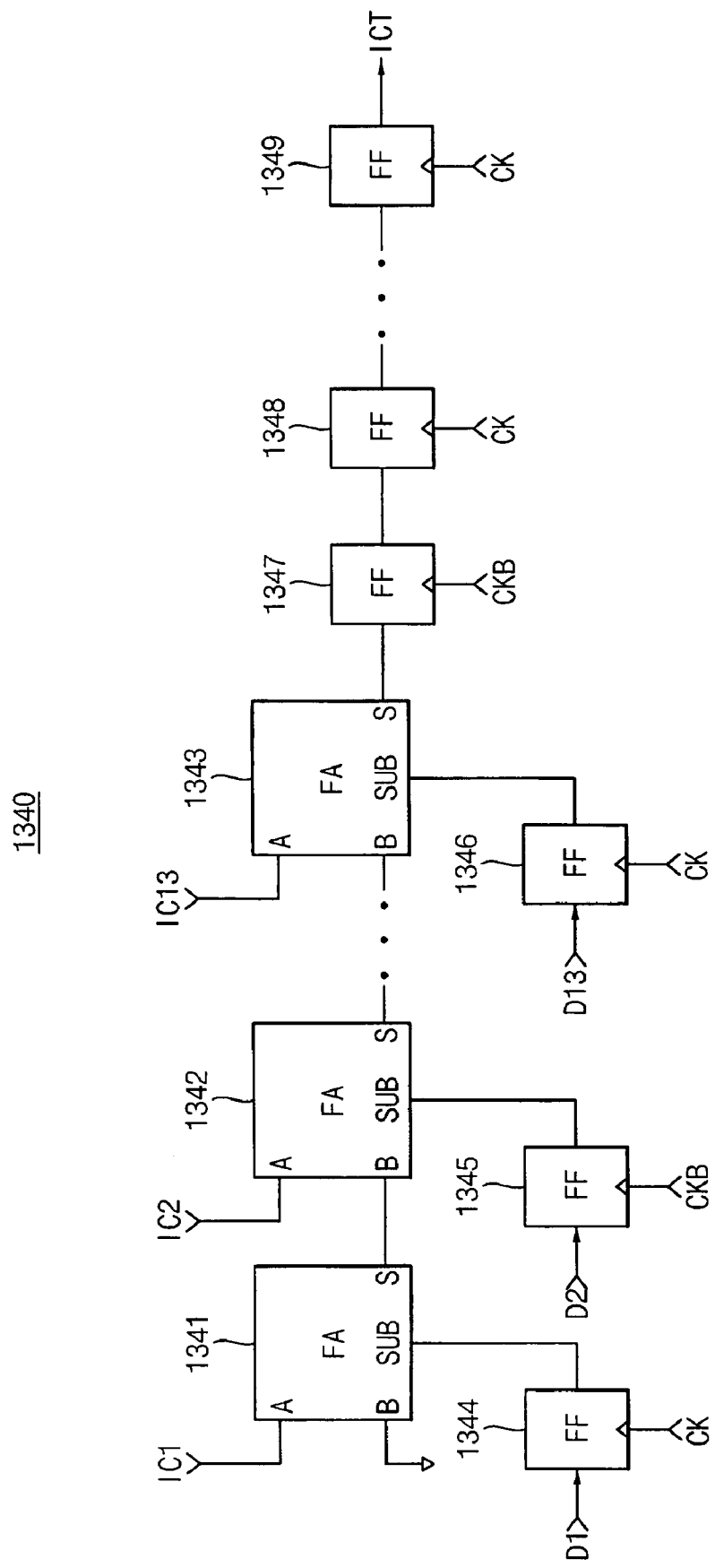
FIG. 17 is a block diagram illustrating a calibration output circuit in the digital calibrating circuit of FIG. 8.

FIG. 17 is a block diagram illustrating a calibration output circuit in the digital calibrating circuit 1300 of FIG. 8.

Referring to FIG. 17, the calibration output circuit 1340 includes flip-flops 1344, 1345 and 1346, adders 1341, 1342 and 1343, and a flip-flop array 1347, 1348 and 1349.

Each of the flip-flops 1344, 1345 and 1346 detects an edge of each bit D1 to D13 of the first digital signal. The adders 1341, 1342 and 1343 are coupled in cascade. Each of the adders 1341, 1342 and 1343 adds an output signal of a prior stage to each of the first calibration coefficients IC1 to IC13. Further, each of the adders 1341, 1342 and 1343 subtracts an output signal of each of the flip-flops 1344, 1345 and 1346 from each of the first calibration coefficients IC1 to IC13. The flip-flop array 1347, 1348 and 1349 delays an output signal of an adder that is located at the end of an array of the adders 1341, 1342 and 1343 to output the second calibration coefficient ICT in response to a clock signal CK and an inverted clock signal CKB.

Figure 18:
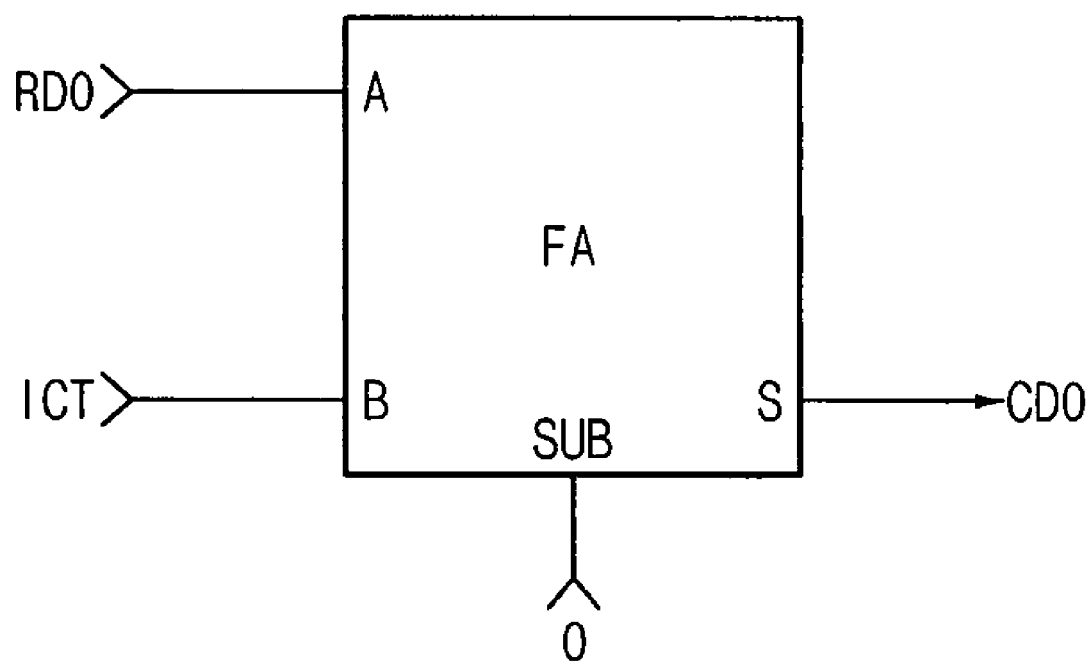
FIG. 18 is a block diagram illustrating an adder in the digital calibrating circuit of FIG. 8.

FIG. 18 is a block diagram illustrating an adder in the digital calibrating circuit 1300 of FIG. 8.

Referring to FIG. 18, the adder 1360 performs an add operation on the second calibration coefficient ICT and the third digital signal RDO to generate the second digital signal CDO.

Figure 19:
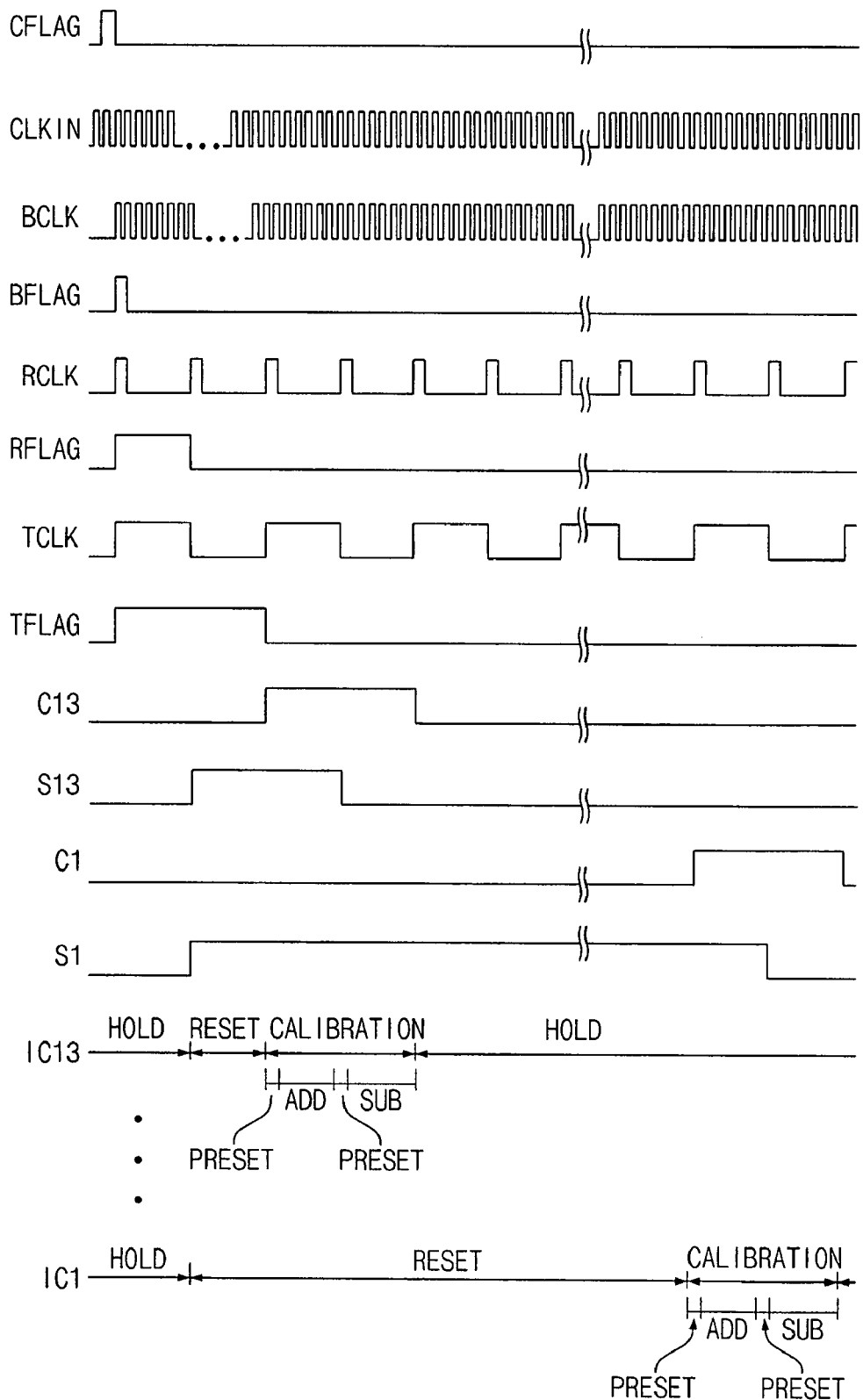
FIG. 19 is a timing diagram illustrating the operation of the digital calibrating circuit of FIG. 8.

FIG. 19 is a timing diagram illustrating the operation of the digital calibrating circuit 1300 of FIG. 8.

Referring to FIG. 19, a calibration logic circuit is activated in response to CFLAG and the thirteenth stage enters a calibration mode. The thirteenth stage has four different modes defined by C13 and S13.

In a reset mode, the thirteenth stage is in a standby mode and an output D is set to 0. The calibration mode includes an adding mode in which the output signal is added and a subtracting mode in which the output signal is subtracted to obtain the calibration coefficient IC13. In a hold mode, calibration coefficients are stored in a memory and are reflected to an output signal of ADC. There are preset modes that are initiated in response to RCLK at the beginning of the adding mode and the subtracting mode. In the preset mode, unstable input data may be pushed away so that the precision of data is increased.

After the thirteenth stage enters the hold mode, the twelfth stage operates in response to control- signals S12 and C12. As such, the operation iterates from the thirteenth stage to the first stage. Then, the mode of ADC changes from EXTRACT/STORE mode to READ/REVISE mode.

FIG. 20A and FIG. 20B are simulation diagrams illustrating the operation of the pipeline ADC 1000 according to an example embodiment of the present invention. FIG. 20A illustrates waveforms before digital calibration, and FIG. 20B illustrates waveforms after digital calibration.

In FIG. 20A and FIG. 20B, DNL represents differential non-linearity and INL represents integral non-linearity. The horizontal line represents a number of bits that ADC can express, and the vertical line represents non-linearity.

As shown in FIG. 20A and FIG. 20B, the differential non-linearity and the integral non-linearity are improved after the calibration.

As described above, the pipeline ADC according to the present invention may perform digital calibration automatically because the pipeline ADC includes a digital calibrating circuit in the converter. The pipeline ADC according to the present invention has good linearity and does not require additional signals because the converter performs the digital calibration in response to a single external flag signal.

While the example embodiments of the present invention and its advantages have been described in detail, it should be understood that various changes, substitutions and alterations can be made herein without departing from the scope of the invention as defined by appended claims.

What is claimed is:

1. A pipeline analog-to-digital converter (ADC), comprising:
   a pipeline converting circuit including a plurality of one-bit stages, the pipeline converting circuit being configured to convert an analog input signal into a first digital signal having a plurality of bits; and
   a digital calibrating circuit configured to extract calibration coefficients for the one-bit stages, and configured to calibrate a feedback signal based on the calibration coefficients and the first digital signal to generate a second digital signal having a plurality of bits,
   wherein the digital calibrating circuit comprises:
   a basic digital calibrating circuit configured to perform a basic calibration on the first digital signal to generate a third digital signal;
   a calibration control circuit configured to generate a reference clock signal, a first calibration control signal having a plurality of bits, and a second calibration control signal having a plurality of bits in response to a first clock signal and a first flag signal;

a calibration-coefficient extracting circuit configured to extract a plurality of first calibration coefficients for the first digital signal in response to the reference clock signal, the first calibration control signal, the second calibration control signal and the feedback signal;

a calibration output circuit configured to generate a second calibration coefficient having a plurality of bits based on each bit of the first digital signal and the first calibration coefficients; and an adder configured to perform an add operation on the third digital signal and the second calibration coefficient to generate the second digital signal.

2. The pipeline ADC of claim 1, wherein the feedback signal is an output signal of the pipeline ADC.

3. The pipeline ADC of claim 2, wherein the digital calibrating circuit is configured to generate the second digital signal in response to a flag signal.

4. The pipeline ADC of claim 1, wherein the calibration control circuit comprises:

a clock generator configured to divide a frequency of the first clock signal to generate a second clock signal, the reference clock signal and the third clock signal;

a flag generator configured to detect the first flag signal to generate a second flag signal in response to the second clock signal, the reference clock signal and the third clock signal; and a calibration control signal generator configured to generate the first calibration control signal and the second calibration control signal in response to the third clock signal and the second flag signal.

5. The pipeline ADC of claim 4, wherein the clock generator comprises:

a first clock divider configured to divide a frequency of the first clock signal by a first dividing ratio to generate the second clock signal;

a second clock divider configured to divide a frequency of the second clock signal by a second dividing ratio to generate the reference clock signal; and a third clock divider configured to divide a frequency of the reference clock signal by a third dividing ratio to generate the third clock signal.

6. The pipeline ADC of claim 5, wherein the first dividing ratio is 1/64, the second dividing ratio is 1/33, and the third dividing ratio is 1/2.

7. The pipeline ADC of claim 4, wherein the flag generator comprises:

a first pulse detector configured to detect an edge of the first flag signal in response to the second clock signal to generate a third flag signal;

a second pulse detector configured to detect an edge of the third flag signal in response to the reference clock signal to generate a fourth flag signal; and a third pulse detector configured to detect an edge of the fourth flag signal in response to the third clock signal to generate the second flag signal.

8. The pipeline ADC of claim 4, wherein the calibration control signal generator comprises:

a flip-flop circuit having (2n)th flip-flops that operates in response to the third clock signal, and (2n−1)th flip-flops that operates in response to a fourth clock signal that is an inverted signal of the third clock signal, n being a positive integer; and an OR gate configured to perform a logical OR operation on output signals of two consecutive flip-flops among the (2n−1)th flip-flops to generate the second calibration control signal, and wherein each bit of the first calibration control signal is out putted at output terminals of the (2n)th flip-flops.

9. The pipeline ADC of claim 1, wherein the calibration-coefficient extracting circuit comprises:

a plurality of calibration control signal generating circuits configured to perform logical operations on each bit of the first and second calibration control signal to generate a third calibration control signal, a fourth calibration control signal and a fifth calibration control signal; and a plurality of calibration-coefficient extracting units for generating each bit of the first calibrating coefficient in response to the reference clock signal, the third calibration control signal, the fourth calibration control signal and the fifth calibration control signal.

10. The pipeline ADC of claim 9, wherein each of the calibration control signal generating circuits comprises:

an OR gate for performing a logical OR operation on each bit of the first and second calibration control signal to generate a third calibration control signal;

a first inverter for inverting the first calibration control signal;

a second inverter for inverting the second calibration control signal;

a first AND gate for performing a logical AND operation on an output signal of the first inverter and each bit of the second calibration control signal to generate a fourth calibration control signal; and a second AND gate for performing a logical AND operation on an output signal of the second inverter and each bit of the first calibration control signal to generate a fifth calibration control signal.

11. The pipeline ADC of claim 9, wherein each of the calibration-coefficient coefficient extracting units comprises:

a first selecting circuit configured to select one of a ground voltage and the second digital signal in response to the reference clock signal;

a second selecting circuit configured to select one of an output signal of the first selecting circuit and the ground voltage in response to the third calibration control signal;

a first flip-flop array configured to delay an output signal of the second selecting circuit;

an adder configured to add a first feedback signal to an output signal of the first flip-flop array, and configured to subtract the fifth calibration control signal from the output signal of the first flip-flop array;

a third selecting circuit configured to select one of the ground voltage and an output signal of the adder in response to the fourth calibration control signal;

a fourth selecting circuit configured to select one of an output signal of the third selecting circuit and the ground voltage in response to the third calibration control signal;

a second flip-flop array configured to delay an output signal of the fourth selecting circuit to output the first feedback signal;

a first divider configured to divide a frequency of the first feedback signal by a first dividing ratio; and a second divider configured to divide a frequency of an output signal of the first divider by a second dividing ratio to generate each bit of the first calibration coefficient.

12. The pipeline ADC of claim 1, wherein the calibration output circuit comprises:

a plurality of flip-flops configured to detect an edge of each bit of the first digital signal;

a plurality of adders coupled in cascade, each of the adders configured to add an output signal of a prior stage to each of the first calibration coefficients and configured to subtract an output signal of each of the flip-flops from each of the first calibration coefficients; and a flip-flop array configured to delay an output signal of an adder that is located at the end of an array of the adders to output the second calibration coefficient in response to a clock signal and an inverted clock signal.

* * * * *

UNITED STATES PATENT AND TRADEMARK OFFICE
CERTIFICATE OF CORRECTION

PATENT NO. : 7,554,470 B2
APPLICATION NO. : 11/982747
DATED : June 30, 2009
INVENTOR(S) : Ho-Young Lee It is certified that error appears in the above-identified patent and that said Letters Patent is hereby corrected as shown below:

Column 14, line 38 delete "coefficient" between "calibration-coefficient" and "extracting"

Signed and Sealed this

Thirteenth Day of October, 2009

David J. Kappos
*Director of the United States Patent and Trademark Office*